THERMOGRAPHICALLY PRODUCED LITHOGRAPHIC PRINTING PLATES

Filed March 10, 1961

Edward C. Yackel
INVENTOR.

BY P. Frank Smith
Lawrence H. Willis
ATTORNEYS 3,283,708
Patented Nov. 8, 1966

3,283,708

THERMOGRAPHICALLY PRODUCED LITHOGRAPHIC PRINTING PLATES

Edward C. Yackel, Rochester, N.Y., assignor to Eastman Kodak Company, Rochester, N.Y., a corporation of New Jersey Filed Mar. 10, 1961, Ser. No. 94,925
11 Claims. (Cl. 101—149.2)

This invention relates to lithographic printing and to printing plates for carrying out the same and particularly to a thermographic method for preparing lithographic printing plates.

A need exists for a method whereby printing plates of the lithographic type can be prepared quickly and inexpensively particularly where relatively short runs are contemplated. With most prior art methods for preparing printing plates of this type there are usually required two or three steps for carrying out the method. For example, where light-sensitive resins are employed there is required the exposure step, usually followed by a development, or etching step, which requires various solvents, etching solutions, etc. Normally light-sensitive coatings for use in this type of process are relatively unstable in storage and the coating accordingly is usually made on a support just prior to the exposure step. Each of these operations adds to the time required for the reproduction of copies and hence the cost per copy. In other well-known methods, an image-wise transfer of an ink-receptive material is made from a matrix sheet to a second support which becomes the printing plate. The support used in such cases most often has hydrophilic properties so that where a hydrophobic material is transferred to the support a printing plate suitable for use in lithography or offset printing is formed. Such processes however, are relatively expensive because of the number of materials used in the process and particularly since the matrix sheet can normally be used in but a single transfer. In other processes for preparing lithographic printing plates, for example in processes which employ light-sensitive diazo compounds, there is normally an inherent storage instability of such compounds resulting in the need to prepare plates involving these compounds a short time before use. Printing plates of this kind, because of their limited stability in unexposed condition and because they are capable of yielding only a limited number of prints, have failed to gain practical importance.

By way of the present invention, I am quite unexpectedly able to produce printing plates by a relatively simple procedure which overcomes each of the aforesaid difficulties. The plates of my invention are readily prepared, inexpensive, give copy reproduction of good quality, and have an unexpected durability when used in a standard offset printing press. It is, accordingly, an object of the present invention to provide a method for preparing lithographic printing plates which meet these aforesaid advantages. A further object is to provide lithographic printing plates suitable for use in an offset printing press. Other objects will become apparent from a reading of the specification and appended claims.

These objects are accomplished by exposing to radiation (e.g., infrared) a graphic original in contact with a lithographic printing element comprising a suitable support having coated thereon a thin continuous layer of a low-melting hydrophobic material which is overcoated with a thin hydrophilic layer containing finely-divided inert, water-absorbent particles, such as diatomaceous earth, silicon dioxide, china clay, and the like. In accordance with the invention, the source of radiation is selected so that it is strongly absorbed by the characters or printed materials to be reproduced. Thus, the characters absorb the radiant energy and transform it into heat which is transmitted to the heat-sensitive coating. The heat transmitted to the coating causes the hydrophobic material in the underlying layer to migrate imagewise into the hydrophilic overcoated layer to produce a lithographic printing surface which is oleophilic in the image areas and which remains hydrophilic in the non-image areas. The printing plate produced thereby can thereafter be used in a standard offset printing press for producing a number of copies of the original.

The invention is briefly illustrated in the accompanying drawings, wherein

Figure 1:
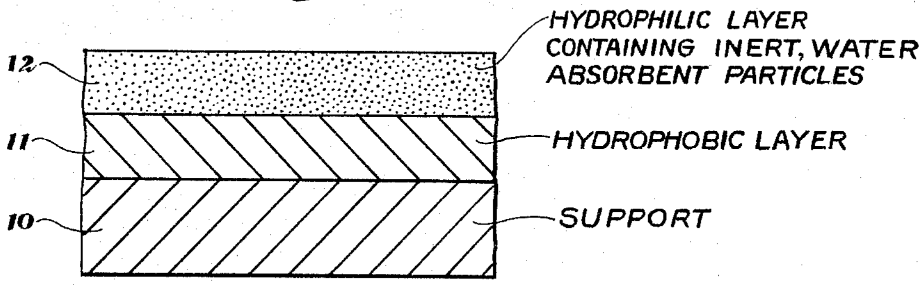
FIG. 1 is a sectional elevational view of a heat-sensitive element which can be employed to produce a lithographic printing plate according to this invention.

In preparing a heat-sensitive element, as shown in FIG. 1, it was found that the thickness of each of the layers thereof was rather important. For example, for the first coating on the support, i.e., hydrophobic material, it was found that coatings in the thickness range from about 0.00005 to about 0.025 inch gave useful results with the preferred thickness range from about 0.0002 to about 0.001 inch. It should be borne in mind also that ideal coating thickness will vary somewhat with the hydrophobic material employed. The material employed in the first coating should be hydrophobic and have a melting point in the range from about 40° to about 120° C. Materials which possess these characteristics include natural waxes, such as beeswax, carnauba wax, Chinese wax, japan wax; hydrocarbon waxes, such as paraffin, petrolatum and mixtures of such waxes with natural waxes; fatty acids such as stearic acid, palmitic acid, oleic acid, etc., and corresponding hydrogenated fatty acids and derivatives thereof and the like. Other hydrophobic wax materials found suitable, i.e., having a melting point between 40° C. and 120° C., include the higher fatty acid salts particularly those formed by the reaction of a cadmium salt with the water-soluble sodium salt of stearic acid to produce cadmium stearate, or, as other examples would indicate, lead palmitate, lead myristate, etc. It will be apparent that other hydrophobic materials, such as certain low molecular weight polymers, resinous substances, etc., can be used in the present invention where such materials are characterized by a melting point within the range from about 40° C. to about 120° C.

The second coating or upper layer of the heat-sensitive element comprises a layer of a hydrophilic material having uniformly dispersed therethrough inert, i.e., water-insoluble, but water-absorbent particles. The thickness of the upper layer can range from about 0.00005 to about 0.005 inch with a preferred thickness in a range from about 0.0001 to about 0.002 inch. It will be apparent that the preferred coating thickness will vary with the hydrophilic material used and with the ratio of the hydrophilic material to absorbent particles. A suitable ratio of hydrophilic vehicle to absorbent particle was found to be in the range from about 1:2 parts to about 1:5 parts vehicle to absorbent particles.

The hydrophilic materials which can advantageously be employed in the present invention include gelatin, with or without hardener, casein admixed with small proportions of aldehyde, carboxymethyl cellulose compounds, gum arabic in association with chromate ion, hydrosol-gelatin compositions, such as those described in the Fowler Patent U.S. 2,772,166, issued November 27, 1956, to Eastman Kodak Company, etc. Particularly suitable for use in the present invention are the proteinaceous hydrophilic colloids. By "proteinaceous" we mean those naturally occurring substantes which are substantially protein in nature, such as gelatin, casein or soy protein, gluten of wheat, zein, and the like. Suitable compositions can comprise such proteinaceous substances as well as mixtures of such substances with other materials, such as hydrosols, polyvinyl alcohol, carboxymethyl cellulose, etc. Advantageously, the hydrophilic materials of the second coating should have a melting point slightly above the melting point of the underlying hydrophobic layer.

The inert, water-absorbent particles which are incorporated in the upper hydrophilic layer, according to the present invention, can include, for example, such materials as diatomite (e.g., kieselguhr, diatomaceous earth, infusorial earth, tripoli powder) which are available under the name of "Celite" and "Super-Floss," a montmorillonite, such as calcium montmorillonite (e.g., fuller's earth), sodium montmorillonite (e.g., bentonite), a hydrous alkali silica (e.g., magnesium silicate or talc), silicon dioxide, barium sulfate, chalk, china clay, hydrated alumina, calcium carbonate, fluorospar, etc., and mixtures thereof including mixtures of china clay with the oxide of zinc, titanium, magnesium, or calcium.

With any of the materials used in coating a support to prepare the heat-sensitive elements of this invention, it is imperative that the materials used to be capable of forming very thin layers whether it be a continuous layer as in the first coat or in a particulate material incorporating layer as in the second coat. In applying the thin layers to a support, it was found that many of the conventional coating methods can be used if the composition to be coated is sufficiently free-flowing to be readily coatable, that is, of readily coatable viscosity. To improve the coatability of some compositions, coating aids, such as saponin, Alkanol B, i.e., alkylnaphthalene sodium sulfonate, etc., can be used. For most purposes and materials hereinbefore enumerated, suitable coating means comprise, for example, dip coating, spray coating, brush coating, doctor blade coating, flow coating, etc. In the usual procedure, it was considered advantageous to have the first coating in an adequately dry state before the second coating was applied.

Suitable supporting materials for the element can comprise any of the well-known supports, such as cellulosic film base, e.g., cellulose acetate, cellulose nitrate, cellulose acetate butyrate, etc.; paper supports, e.g., map overlay tracing parchment, glassine paper, vegetable parchment, etc.; metals, e.g., zinc, aluminum, etc.; glass; synthetic materials, e.g., polystyrene, polyethylene terephthalate, polypropylene, etc., and the like. The preferred supporting materials for use in the invention are materials which are heat insulating so that infrared radiation converted to heat in areas corresponding to the printed characters of the original is not readily dissipated. In some cases in which a radiation exposure is to be given through the support, it is desired to use infrared transparent supporting materials. Alternative practices of this type are discussed below.

Figure 2:
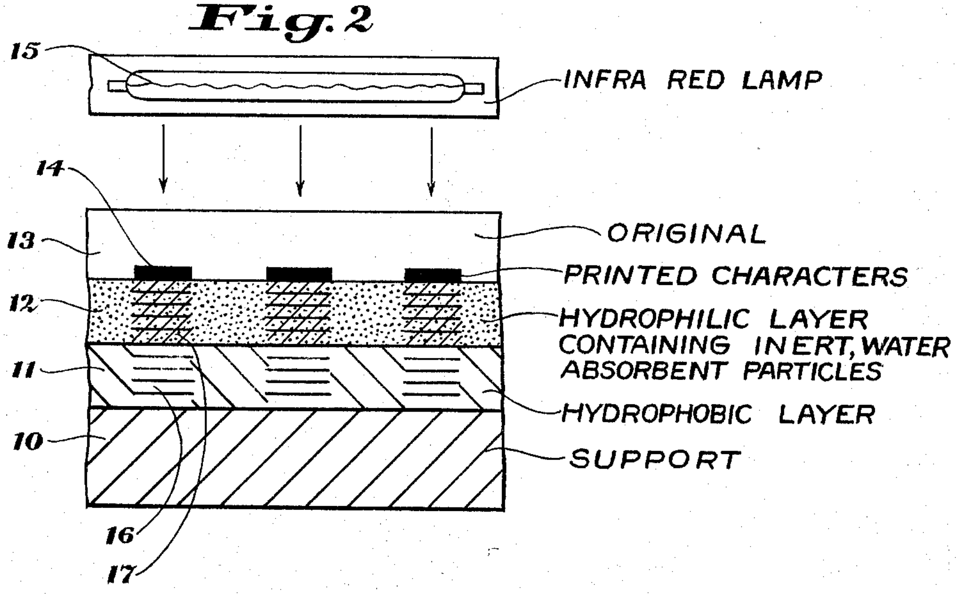
FIG. 2 is a sectional elevational view of an assembly for producing an imaged lithographic plate in accordance with the practice of this invention.

Heat-sensitive elements prepared in the above manner form lithographic printing plates when given a radiation exposure in contact with a graphic original. The heat-sensitive element of this invention is graphically illustrated in FIG. 1 of the accompanying drawing. As shown in FIG. 1, the support 10 is coated with a first layer 11 of a low-melting hydrophobic material and a second coating 12 of a slightly higher melting hydrophilic layer which has uniformly dispersed therethrough inert, water-absorbent particles. By exposure of a heat-sensitive element of FIG. 1 to a radiation source, as shown in FIG. 2 of the accompanying drawing, a lithographic printing plate is produced. As shown in FIG. 2, an original 13 having printed characters 14 is irradiated from an infrared lamp 15 when in contact with a heat-sensitive element of FIG. 1. The radiant energy from the infrared lamp 15 is absorbed by the printed characters 14 and converted to heat 16 which is transmitted to the hydrophilic layer 12 and hydrophobic layer 11 of the element. The heat generated in the image area causes the hydrophobic material of the first layer 11 to melt and migrate into the hydrophilic layer 12 to form oleophilic, image printing areas 17, contrasting with an otherwise hydrophilic surface. The exact manner in which the melted hydrophobic substance migrates into the hydrophilic layer is not known. Presumably the inert, water-absorbent particles act as channels for the flow of material from the first layer to the outer layer. If this occurs, it is reasoned, it must be due to a withdrawing of the hydrophilic substance from around each absorbent particle as a result of heating in those areas. The definition obtained in the final printing plate is very high which appears to rule out the simple exchange of hydrophobic material for hydrophilic material under the influence of high temperature. Whatever the reason, the final printing plate produced by the present invention gave good reproducing results and was durable as a printing surface beyond any expectation for the thin light-weight coatings employed as the printing surface.

Suitable radiant energy for exposing the heat-sensitive elements to produce a lithographic printing surface according to the present invention can be obtained from electrically heated incandescent filaments, electric arcs, focused sunlight, etc., which is largely within the infrared or near-infrared range. A convenient source is the electric filament which is partially enclosed in a suitable reflector. Another source of radiation which has given good results consists of a standard 500-watt infrared bulb with internal reflector, operated under overload conditions of 800-watt input, and at a distance of about three inches from the printed graphic original. Photoflash bulbs can also be used as the radiation source. Other sources having a high output of radiant energy, particularly of wavelengths of less than 25,000 angstroms, and capable of uniformly irradiating large areas, can also be used.

In exposing a heat-sensitive element of the present invention to produce a lithographic printing plate therefrom, the infrared exposure can be applied in several ways to an assembly comprising a negative or positive copy medium and a printing element of this invention. For example, where a graphic original is to be reproduced, it is the usual procedure to place the printing element on the reverse side of the original with the printing surface of the element in contact with the support of the original. This assembly then is normally exposed by directing the infrared radiation onto the graphic side of the original. In other cases, it may be desirable to direct the exposing radiation onto the reverse side of the printing element. In either case, it is desirable that the support of the original to be copied, be substantially infrared transmitting and preferably be heat conducting and thin so that unwanted lateral diffusion of the heat generated in the image areas, as it traverses the support, is minimized. Where the infrared radiation is directed to the support side of the printing element, it is important that said support be substantially infrared transparent.

In another manner of practice of the present invention, the infrared radiation is directed onto the rear surface of the original to be reproduced. In this manner the assembly is arranged so that the graphic areas, i.e., printed characters of the original are in contact with the heat-sensitive layer of the printing element. In this case, the original should be infrared transmitting, except in the printed character areas thereof which absorb the radiant energy converting it to heat, which, in turn, is transmitted to the heat-sensitive layer producing the desired effect in accordance with the invention. Alternatively, the printing element can be exposed from the support side of the printing element with the graphic areas of the original in contact with the heat-sensitive layer on the reverse side of said element. In this case it is required that the support of the printing plate be substantially infrared transparent, and, moreover, it is usually desirable to have a heat-insulating, but infrared transmitting, means, e.g., glass, supplied to the rear surface of the original in order to localize and intensify the heat received by the heat-sensitive surface of the printing element.

Preparing a lithographic plate for offset printing according to this latter assembly, however, requires the use of a laterally reversed original in order to obtain a right-reading copy as the final print when the plate is used in a conventional offset printing press. Laterally reversed copies for use as originals in such cases can be prepared a number of ways, for example, by photography in which a stripping film is used, by typing in which a carbon copy is produced from an assembly having the carbon paper assembled in dye contact on the reverse side of the typed copy, etc.

Adaptations for exposure of the printing element according to the invention are well understood by those skilled in the art and have been illustrated in a number of domestic and foreign patents. See, for example, Miller U.S. Patent 2,663,657, issued December 22, 1953.

The lithographic printing plates prepared according to a process of the present invention can be employed in a conventional offset or lithographic printing process. In a printing process using the offset printing plates of the present invention, the printing surface of the printing element is first wetted with water so that the hydrophilic areas of the surface take on the water and become damp thereby so that a subsequent treatment with the greasy ink does not ink the surface in the hydrophilic areas but only in the hydrophobic or oleophilic areas thereof. The "inked" plate is then pressed in contact with a copy sheet or indirectly onto an offset blanket for transfer therefrom to a copy sheet. The greasy inks for inking the imaged areas of the plate can comprise any of the well-known greasy inks as used in conventional processes of lithographic printing. Such inks normally comprise dyestuffs which are prepared in a waxy base, or are dye materials which are soluble in organic solvents.

The invention will now be further illustrated by the following examples.

*Example 1*

A strip of ordinary cellulose acetate film base was doctor-blade coated with a 10 percent solution of beeswax at a thickness of 0.003 inch. The strip was dried overnight at room temperature and was then overcoated with a layer of the following mixture:

| | |
|---|---|
| Gelatin ____________________________gram__ | 3.0 |
| Microcel C (Tradename of Johns-Manville Co. for a modified diatomaceous earth) ____gram__ | 10.0 |
| Saponin ____________________________do____ | 1.0 |
| Formaldehyde (1% solution) ___________ml__ | 1.0 |
| Water to make _______________________do__ | 100.0 |

The above mixture was ball-milled for 24 hours and then doctor-blade coated over the first layer of beeswax at a thickness of 0.00026 inch. After drying overnight at room temperature, the element was placed on the reverse side of an original document with the heat-sensitive surface of said element in contact with the support side of said original. The assembly was then exposed to infrared radiation with the radiation being directed onto the graphic side of the original. The printed portions of the original converted the radiant energy to heat which was transmitted to the heat-sensitive layers of the element causing hydrophobic areas to occur in the surface of the element corresponding to the printed characters of the original. No change occurred in the surface of the element in those areas which were not in heat-conductive relationship with the original since the non-printed areas of the original transmit or reflect the infrared radiation without a conversion of such radiation to heat.

The element, after exposure, was separated from the graphic original and placed in a standard offset printing press and inked in a conventional manner. Copies of the original were obtained which were of very good quality.

*Example 2*

A strip of map overlay tracing parchment sold by the Rhinelander Paper Company was flow-coated with a layer of carnauba wax at a thickness of 0.00025 inch and dried. A layer of the following composition was prepared for coating as a second layer:

| | |
|---|---|
| Casein ______________________________grams__ | 2.0 |
| Silicon dioxide _________________________do____ | 8.0 |
| Formaldehyde (1% solution) _____________ml__ | 2.0 |

The above composition was ball-milled for 48 hours and then flow-coated as a second layer at a thickness of 0.00015 inch. The element was then dried and thermographically exposed as in Example 1. Good copies of an original document were obtained by employing the lithographic printing plate in a conventional offset printing press.

*Example 3*

A zinc metal sheet was coated with a layer of Japan wax at a thickness of 0.0003 inch. After drying, a hydrosol-gelatin composition containing 10 parts china clay was coated at a 0.002 inch thickness over the first wax layer. The coating composition was prepared as follows:

A hydrosol was prepared using a monomer mixture 171 parts of ethylacrylate, 73 parts of acrylonitrile, and 110 parts of acrylic acid. A hydrosol having a pH of 3.5 was obtained. Ammonium hydroxide was added to raise the pH to approximately 6 and the hydrosol was then mixed with aqueous gelatin to give a final solution of 8 parts gelatin to 2 parts hydrosol. The hydrosol gel solution (A) was then employed as follows:

| | |
|---|---|
| Solution A ___________________________grams__ | 4 |
| China clay ___________________________do____ | 10 |
| Alkanol B (alkylnaphthalene sodium sulfonate)_ml__ | 1 |

The above composition was ball-milled for 2 hours and then coated onto the first layer as indicated above to produce the heat-sensitive element. The element was then exposed to infrared radiation as in Example 1 to produce a lithographic printing plate having good offset printing characteristics. A large number of copies of an original document were obtained by running the printing plate in a conventional offset press.

The uses of the printing plates of this invention are immediately apparent. The advantages of an offset printing plate which will make a number of reproductions of an original document easily, and at low cost per copy, are numerous. Heretofore, with most processes of document reproduction to produce good quality reproductions, it has been necessary to expend considerable time and expense to obtain such copies. The present invention overcomes these difficulties by presenting a simple one-step inexpensive process which accomplishes the objective in a minimum of time. The need for such a process and the printing plates produced thereby will find wide acceptance in the trade particularly since in recent times the need for document reproduction and office copying of various publications and circulars has become generally emphasized.

The invention has been described in detail with particular reference to preferred embodiments thereof, but it will be understood that variations and modifications can be effected within the scope and spirit of the invention as hereinbefore described and as defined in the appended claims.

I claim:

1. A heat-sensitive copying material adapted for the preparation of a lithographic printing plate comprising (A) a support having coated thereon, (B) a substantially homogenous layer having a thickness of from 0.00005 to 0.025 inch and comprising a hydrophobic ink-receptive material which melts at a temperature in the range from 40–120° C., and coated over said substantially homogeneous layer, (C) a hydrophilic layer having a thickness of from 0.00005 to 0.005 inch and comprising (*a*) a hydrophilic ink-repellent material having uniformly dispersed therethrough (*b*) inert, water-absorbent particles, the ratio of said hydrophilic material to said particles being in the range from about 1:2 to about 1:5, said hydrophilic layer melting only above the melting temperature of said hydrophobic material and being permeable by said hydrophobic material in its melted state.

2. A heat-sensitive copying material as defined in claim 1 wherein said hydrophobic layer has a thickness of from 0.0002 to 0.001 inch and said hydrophilic layer has a thickness of from 0.0001 to 0.002 inch.

3. A heat-sensitive copying material as defined in claim 1 wherein said hydrophilic ink-repellent material is selected from the class consisting of gelatin, casein admixed with small proportions of an aldehyde, carboxymethyl cellulose, gum arabic and polyvinyl alcohol.

4. A heat-sensitive copying material as defined in claim 1 wherein said inert, water-absorbent particles are selected from the class consisting of diatomaceous earth, silicon dioxide and china clay.

5. A process for producing a lithographic printing plate comprising (A) placing a two-ply combination of a documentary original comprising image areas substantially absorptive of infrared radiation and non-image areas substantially non-absorptive of said infrared radiation in contact with a heat-sensitive copying material comprising (*a*) a support having coated thereon (*b*) a substantially homogeneous layer having a thickness of from 0.00005 to 0.025 inch and comprising a hydrophobic ink-receptive material melting substantially within the range of about from 20 to 120° C., and coated over said substantially homogeneous layer, (*c*) a layer having a thickness of from 0.00005 to 0.025 inch and comprising hydrophilic ink-repellent material having uniformly dispersed therethrough inert, water-absorbent particles, said hydrophilic layer (*c*) melting only above the melting temperature of said hydrophobic layer (*b*), and the ratio of said hydrophilic material to said particles being in the range from about 1:2 to about 1:5, (B) exposing strongly and briefly said two-ply combination to radiation rich in infrared energy, thereby causing the development of a heat pattern in said original corresponding to the image portions thereof and causing substantial melting of said hydrophobic material but substantially no melting of said hydrophilic material and said inert particles, (C) diffusing said melted hydrophobic material in an imagewise manner upwardly through said hydrophilic layer, thus rendering said hydrophilic layer hydrophobic in the surface portions thereof receiving said diffused, melted hydrophobic material.

6. A process according to claim 5 wherein said hydrophobic layer has a thickness of from 0.0002 to 0.001 inch and said hydrophilic layer has a thickness of from 0.0001 to 0.002 inch.

7. A process according to claim 5 wherein said hydrophilic ink-repellent material is selected from the class consisting of gelatin, casein admixed with small proportions of an aldehyde, carboxymethyl cellulose, gum arabic and polyvinyl alcohol.

8. A process according to claim 5 wherein said inert, water-absorbent particles are selected from the class consisting of diatomaceous earth, silicon dioxide and china clay.

9. A heat-sensitive copying material adapted for the preparation of a lithographic printing plate comprising (A) a support having coated thereon, (B) a substantially homogeneous layer having a thickness of from 0.00005 to 0.025 inch and comprising a hydrophobic ink-receptive material, and coated over said substantially homogeneous layer, (C) a layer having a thickness of from 0.00005 to 0.005 inch and comprising (*a*) a hydrophilic ink-repellent material having uniformly dispersed therethrough (*b*) insert, water-absorbent particles, the ratio of said hydrophilic ink-repellent material to inert, water-absorbent particles being within the range of from about 1:2 to about 1:5, said homogeneous layer melting substantially when heated to a temperature between about 40 and 120° C. and said hydrophilic layer melting only above the melting temperature of said hydrophobic layer.

10. A process for producing a lithographic printing plate comprising (A) placing a two-ply combination of a documentary original comprising image areas substantially absorptive of infrared radiation and non-image areas substantially non-absorptive of said infrared radiation in contact with a heat-sensitive copying material comprising (*a*) a support having coated thereon (*b*) a substantially homogeneous layer having a thickness of from 0.00005 to 0.025 inch and comprising a hydrophobic ink-receptive material melting substantially within the range of about from 40 to 120° C., and coated over said substantially homogeneous layer (*c*) a layer having a thickness of from 0.00005 to 0.025 inch and comprising hydrophilic ink-repellent material having uniformly dispersed therethrough inert, water-absorbent particles, the ratio of said hydrophilic ink-repellent material to inert, water-absorbent particles being within the range of from about 1:2 to about 1:5, (B) exposing strongly and briefly said two-ply combination to radiation rich in infrared energy, thereby causing the development of a heat pattern in said original corresponding to the image portions thereof and causing substantial melting of said hydrophobic material but substantially no melting of said hydrophilic material and said inert particles, (C) diffusing said melted hydrophobic material in an imagewise manner upwardly through said hydrophilic layer, thus rendering said hydrophilic layer hydrophobic in the surface portions thereof receiving said diffused, melted hydrophobic material.

11. A heat-sensitive copying material adapted for the preparation of a lithographic printing plate comprising (A) a support, having coated directly thereon (B) a substantially homogeneous hydrophobic layer having a thickness of from 0.0003 to 0.0005 inch and comprised of a hydrophobic ink-receptive wax, said layer melting substantially when heated to a temperature between about 120 and 200° F., and, coated over said hydrophilic layer, (C) a hydrophilic layer having a thickness of from 0.00005 to 0.0002 inch and comprised of a hydrophilic ink-repellent material having uniformly dispersed therethrough inert, water-absorbent particles, the ratio of hydrophilic material to water-absorbent particles ranging from about 1:3 to 1:5, said hydrophilic layer melting only above the melting temperature of said hydrophobic layer; said hydrophilic layer being capable of being penetrated by the composition of the underlying hydrophobic layer, when the latter is heated to above its melting temperature but below the melting temperature of the hydrophilic layer, whereby hydrophobic, ink-receptive areas may be formed on the outer surface of the hydrophilic layer by such heating.

References Cited by the Examiner

UNITED STATES PATENTS

| | | | |
|---|---|---|---|
| 1,245,120 | 10/1917 | Neidich | 101—149.2 |
| 2,606,130 | 8/1952 | Alexewicz et al. | 117—76 |
| 2,663,657 | 12/1953 | Miller | 250—65 |
| 2,800,077 | 7/1957 | Marron | 101—149.2 |
| 2,950,987 | 8/1960 | Howard | 250—65 |
| 2,967,785 | 1/1961 | Allen | 250—65 |

DAVID KLEIN, *Primary Examiner.*

RALPH G. NILSON, ROBERT E. PULFREY, WILLIAM B. PENN, *Examiners.*

J. W. LAWRENCE, *Assistant Examiner.*

UNITED STATES PATENT OFFICE
CERTIFICATE OF CORRECTION

Patent No. 3,283,708 November 8, 1966

Edward C. Yackel

It is hereby certified that error appears in the above numbered patent requiring correction and that the said Letters Patent should read as corrected below.

Column 8, line 65, for "hydrophilic" read -- hydrophobic --.

Signed and sealed this 12th day of September 1967.

(SEAL)
Attest:

ERNEST W. SWIDER
Attesting Officer

EDWARD J. BRENNER
Commissioner of Patents